(12) United States Patent
Guo et al.

(10) Patent No.: US 8,431,490 B2
(45) Date of Patent: Apr. 30, 2013

(54) METHOD OF CHEMICAL MECHANICAL POLISHING A SUBSTRATE WITH POLISHING COMPOSITION ADAPTED TO ENHANCE SILICON OXIDE REMOVAL

(75) Inventors: Yi Guo, Newark, DE (US); Zhendong Liu, King of Prussia, PA (US); Kancharla-Arun Kumar Reddy, Bear, DE (US); Guangyun Zhang, Furlong, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 29 days.

(21) Appl. No.: 12/750,799

(22) Filed: Mar. 31, 2010

(65) Prior Publication Data
US 2011/0244685 A1  Oct. 6, 2011

(51) Int. Cl.
*H01L 31/31051*  (2006.01)

(52) U.S. Cl.
USPC ........... 438/693; 438/689; 438/691; 438/692; 216/88; 216/89; 252/79.1; 257/E21.23; 451/28

(58) Field of Classification Search ................. 252/79.1; 216/88, 89; 438/689, 691–693; 451/28; 257/E21.23
See application file for complete search history.

(56) References Cited

U.S. PATENT DOCUMENTS

| 6,322,600 | B1 | 11/2001 | Brewer et al. | |
|---|---|---|---|---|
| 7,446,046 | B2 | 11/2008 | Zhang et al. | |
| 7,452,481 | B2 | 11/2008 | Suzuki et al. | |
| 2004/0157985 | A1* | 8/2004 | Masui et al. | 524/589 |
| 2004/0186206 | A1* | 9/2004 | Yoneda et al. | 524/95 |
| 2004/0198203 | A1* | 10/2004 | Kawamura et al. | 451/526 |
| 2005/0031789 | A1* | 2/2005 | Liu et al. | 427/340 |
| 2005/0066585 | A1* | 3/2005 | Bian et al. | 51/307 |
| 2005/0205837 | A1* | 9/2005 | Miwa | 252/79.1 |
| 2006/0124026 | A1* | 6/2006 | Kollodge | 106/3 |
| 2006/0255314 | A1* | 11/2006 | Suzuki et al. | 252/79.1 |
| 2007/0251155 | A1* | 11/2007 | Dysard et al. | 51/298 |
| 2008/0197112 | A1* | 8/2008 | Wang et al. | 216/89 |
| 2009/0014683 | A1 | 1/2009 | Zhang et al. | |
| 2011/0045203 | A1* | 2/2011 | Grovola et al. | 427/535 |

FOREIGN PATENT DOCUMENTS
WO   WO 2007130350 A1 * 11/2007

OTHER PUBLICATIONS

Stanley Wolf, "Silicon Processing for the VLSI Era", vol. 4, Lattice Press, 2002, pp. 335-346.*

* cited by examiner

*Primary Examiner* — Lan Vinh
*Assistant Examiner* — David Kaufman
(74) *Attorney, Agent, or Firm* — Thomas S. Deibert

(57) ABSTRACT

A method for chemical mechanical polishing of a substrate is provided, comprising: providing a substrate, wherein the substrate comprises silicon oxide; providing a chemical mechanical polishing composition, comprising, as initial components: water; an abrasive; and a substance according to formula I

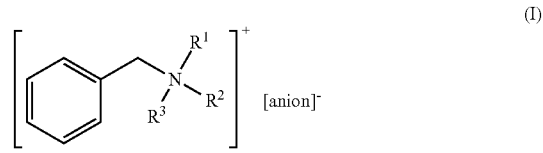

wherein $R^1$, $R^2$ and $R^3$ are each independently selected from a $C_{1-4}$ alky group; providing a chemical mechanical polishing pad with a polishing surface; moving the polishing surface relative to the substrate; dispensing the chemical mechanical polishing composition onto the polishing surface; and, abrading at least a portion of the substrate to polish the substrate; wherein the substance according to formula I included in the chemical mechanical polishing composition provides an enhanced silicon oxide removal rate and an improved polishing defectivity performance; and, wherein at least some of the silicon oxide is removed from the substrate.

3 Claims, No Drawings

METHOD OF CHEMICAL MECHANICAL POLISHING A SUBSTRATE WITH POLISHING COMPOSITION ADAPTED TO ENHANCE SILICON OXIDE REMOVAL

The present invention relates to chemical mechanical polishing compositions and methods of using the same. More particularly, the present invention relates to chemical mechanical polishing compositions for polishing a substrate comprising silicon oxide, wherein at least some of the silicon oxide is removed from the substrate.

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry.

Chemical mechanical planarization is commonly used on shallow trench isolation (STI) layers and on inter-layer dielectric (ILD) or inter-metal dielectric (IMD) layers in the fabrication of semiconductor devices. These dielectric layers act as electrical isolation layers between adjacent semiconductors and conducting pathways. The deposited dielectric material is often referred to as a shallow trench isolation structure or an interlayer dielectric insulator in the semiconductor device. In forming these structures, a problem exists regarding the polishing of the dielectric materials (e.g., silicon oxide) to a suitable planarity quickly without the creation of defects (e.g., scratches). As the size of structures on semiconductor devices continue to shrink, what performance criteria was once acceptable for planarizing and defectivity of polishing dielectric materials becomes increasing less acceptable. Scratches which were once considered acceptable, are today becoming yield limiting.

One polishing formulation for use in a chemical mechanical planarization process that provides a planarization composition with assertedly improved defectivity for dielectric layer polishing is disclosed in U.S. Pat. No. 6,322,600 (Brewer et al.). Brewer et al. disclose a planarization composition having a pH from 9 to 11.5, comprising an alkosol comprising: spherical, monodisperse alkylsilicate particles, in that at least 90 wt % of the particles have a diameter which are no more than 20% different from the weight average diameter, and a liquid carrier comprising: an alcohol, in the range of 0 to 9 wt %, a base and the remainder, water.

Notwithstanding, to support the dynamic field of device designs for use in the manufacture of semiconductor systems there exists a continued need for chemical mechanical polishing compositions formulated to provide a desirable balance of polishing properties to suit changing design needs. For example, there remains a need for chemical mechanical polishing compositions that exhibit a low defectivity dielectric polishing performance, tailored silicon oxide removal rate and tailored removal rate selectivity between silicon nitride and silicon oxide.

The present invention provides a method for chemical mechanical polishing of a substrate, comprising: providing a substrate, wherein the substrate comprises silicon oxide; providing a chemical mechanical polishing composition, comprising, as initial components: water; an abrasive; and a substance according to formula I

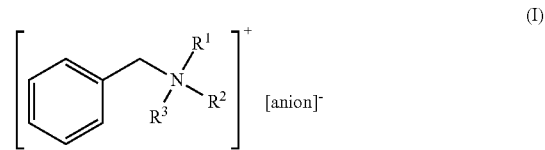

wherein $R^1$, $R^2$ and $R^3$ are each independently selected from a $C_{1-4}$ alky group; providing a chemical mechanical polishing pad with a polishing surface; moving the polishing surface relative to the substrate; dispensing the chemical mechanical polishing composition onto the polishing surface; and, abrading at least a portion of the substrate to polish the substrate; wherein the substance according to formula I included in the chemical mechanical polishing composition provides an enhanced silicon oxide removal rate and an improved polishing defectivity performance; and, wherein at least some of the silicon oxide is removed from the substrate.

The present invention also provides a method for chemical mechanical polishing of a substrate, comprising: providing a substrate, wherein the substrate comprises silicon oxide and silicon nitride; providing a chemical mechanical polishing composition, comprising, as initial components: water; an abrasive; a substance according to formula I

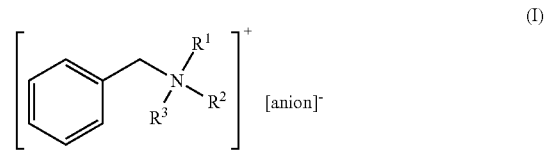

wherein $R^1$, $R^2$ and $R^3$ are each independently selected from a $C_{1-4}$ alky group; and a substance according to formula II

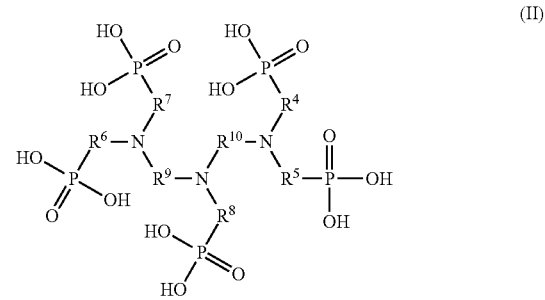

wherein each of $R^4$, $R^5$, $R^6$, $R^7$, $R^8$, $R^9$ and $R^{10}$ is a bridging group having a formula —$(CH_2)_n$—, wherein n is an integer selected from 1 to 10; providing a chemical mechanical polishing pad with a polishing surface; moving the polishing surface relative to the substrate; dispensing the chemical mechanical polishing composition onto the polishing surface; and, abrading at least a portion of the substrate to polish the substrate; wherein the substance according to formula I included in the chemical mechanical polishing composition provides an enhanced silicon oxide removal rate and an improved polishing defectivity performance; and, wherein at least some of the silicon oxide is removed from the substrate.

DETAILED DESCRIPTION

The chemical mechanical polishing method of the present invention is useful for polishing a substrate comprising silicon oxide. The chemical mechanical polishing composition used in the method of the present invention contains a silicon dioxide rate enhancing amount of a substance according to formula I

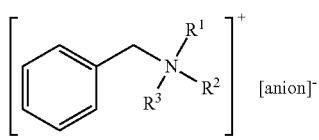

wherein $R^1$, $R^2$ and $R^3$ are each independently selected from a $C_{1-4}$ alky group; and wherein the anion can be any suitable anion.

The term "enhanced silicon oxide removal rate" used herein and in the appended claims to describe the removal rate of silicon oxide (for removal rate measured in Å/min) resulting from the addition of a substance according to formula I to the chemical mechanical polishing composition means that the following expression is satisfied:

$$A > A_0$$

wherein A is the silicon oxide removal rate in Å/min for a chemical mechanical polishing composition containing a substance according to formula I used in the method of the present invention, as measured under the polishing conditions set forth in the Examples; $A_0$ is the silicon oxide removal rate in Å/min obtained under identical conditions except that the substance according to formula I is absent from the chemical mechanical polishing composition.

The term "improved polishing defectivity performance" used herein and in the appended claims to describe the defectivity performance obtained through the inclusion of a substance according to formula I in the chemical mechanical polishing composition used of the chemical mechanical polishing method of the present invention means that the following expression is satisfied:

$$X < X_0$$

wherein X is the defectivity (i.e., post CMP/hydrogen fluoride scratches) for a chemical mechanical polishing composition containing the substance according to formula I used in the method of the present invention, as measured under the polishing conditions set forth in the Examples; and $X_0$ is the defectivity (i.e., post CMP/hydrogen fluoride scratches) obtained under identical conditions except that the substance according to formula I is absent from the chemical mechanical polishing composition.

The water contained in the chemical mechanical polishing composition used in the chemical mechanical polishing method of the present invention is preferably at least one of deionized and distilled to limit incidental impurities.

The chemical mechanical polishing composition used in the chemical mechanical polishing method of the present invention contains 0.1 to 40 wt % abrasive; preferably 5 to 25 wt % abrasive. The abrasive used preferably has an average particle size of ≦200 nm; more preferably 75 to 150 nm; most preferably 100 to 150 nm.

Abrasive suitable for use in the chemical mechanical polishing composition used in the chemical mechanical polishing method of the present invention include, for example, inorganic oxides, inorganic hydroxides, inorganic hydroxide oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations comprising at least one of the foregoing oxides. Modified forms of these inorganic oxides, such as, organic polymer-coated inorganic oxide particles and inorganic coated particles can also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides.

The preferred abrasive for use in the chemical mechanical polishing composition used in the chemical mechanical polishing method of the present invention is colloidal silica. Preferably, the colloidal silica used contains at least one of precipitated silica and agglomerated silica. Preferably, the colloidal silica used has an average particle size of ≦200 nm, more preferably 75 to 150 nm, most preferably 100 to 150 nm; and accounts for 0.1 to 40 wt %, preferably 5 to 25 wt % of the chemical mechanical polishing composition.

The chemical mechanical polishing composition used in the chemical mechanical polishing method of the present invention preferably contains, as an initial component, 0.001 to 5 wt % of a substance according to formula I

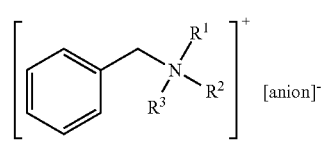

wherein $R^1$, $R^2$ and $R^3$ are each independently selected from a $C_{1-4}$ alky group, preferably a $C_{1-2}$ alkyl group, most preferably a methyl group; and wherein the anion can be any suitable anion, preferably an anion selected from hydroxide and a halogen, more preferably hydroxide. In some preferred applications, the chemical mechanical polishing composition optionally contains, as an initial component, 0.001 to 1 wt %, more preferably 0.1 to 1 wt %, most preferably 0.1 to 0.3 wt % of the substance according to formula I. Most preferably, the substance according to formula I is benzyltrimethylammonium hydroxide.

Optionally, the chemical mechanical polishing composition used in the chemical mechanical polishing method of the present invention further contains, as an initial component, a substance according to formula II

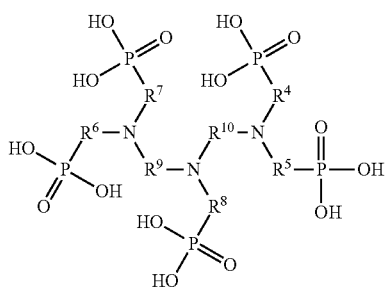

(II)

wherein each of $R^4$, $R^5$, $R^6$, $R^7$, $R^8$, $R^9$ and $R^{10}$ is a bridging group having a formula —$(CH_2)_n$—, wherein n is an integer selected from 1 to 10. Preferably, n is an integer independently selected from 1 to 4 for each of $R^4$, $R^5$, $R^6$, $R^7$, $R^8$, $R^9$ and $R^{10}$. More preferably, n is an integer independently selected from 2 to 4 for each of $R^4$, $R^5$, $R^6$, $R^7$, $R^8$, $R^9$ and $R^{10}$. Most preferably the a substance according to formula II is selected from diethylenetriaminepentakis(methylphosphonic acid), which has the following formula

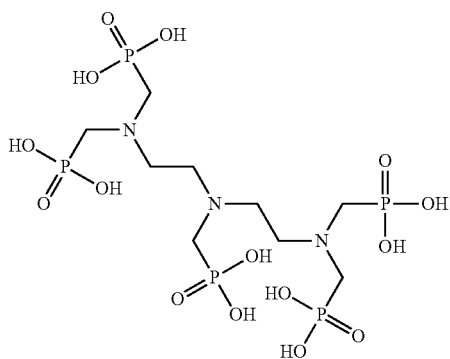 [SMILES: O=P(O)(O)CN(CCN(CP(=O)(O)O)CP(=O)(O)O)CCN(CP(=O)(O)O)CP(=O)(O)O]

and bis(hexamethylene)triamine-pentakis(methylphosphonic acid), which has the following formula

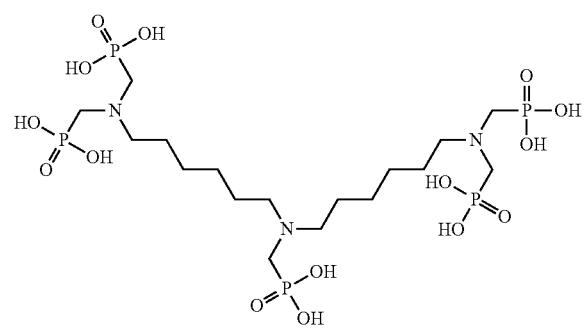 [SMILES: O=P(O)(O)CN(CCCCCCN(CP(=O)(O)O)CP(=O)(O)O)CCCCCCN(CP(=O)(O)O)CP(=O)(O)O]

Optionally, one or more of the nitrogens in the substance according to formula II can be provided in a quaternary form, wherein the nitrogen assumes a positive charge.

Optionally, the chemical mechanical polishing composition used in the chemical mechanical polishing method of the present invention further contains, as an initial component, 0.001 to 5 wt % of the substance according to formula II. Optionally, the chemical mechanical polishing composition optionally contains, as an initial component, 0.001 to 1 wt %, more preferably 0.1 to 1 wt %, most preferably 0.1 to 0.3 wt % of the substance according to formula II.

Inclusion of the optional substance according to formula II in the chemical mechanical polishing composition used in the chemical mechanical polishing method of the present invention facilitates a tailoring of the removal rate selectivity between silicon oxide and silicon nitride for use in applications wherein the substrate further comprises silicon nitride in addition to silicon oxide.

Optionally, the chemical mechanical polishing composition used in the chemical mechanical polishing method of the present invention further contains additional additives selected from dispersants, surfactants, buffers, anti-foaming agents and biocides.

The chemical mechanical polishing composition used in the chemical mechanical polishing method of the present invention has a pH of $\geq 7$, preferably 7 to 12, more preferably 10 to 11. The chemical mechanical polishing composition used can include inorganic and organic pH adjusting agent. Optionally, the pH adjusting agent is selected from an inorganic acid or base (e.g., nitric acid, sulfuric acid, hydrochloric acid, phosphoric acid, potassium sulfate and potassium hydroxide).

The substrate polished in the chemical mechanical polishing method of the present invention comprises silicon oxide. The silicon oxide in the substrate can be any suitable silicon oxide material known in the art; for example, borophosphosilicate glass (BPSG), plasma-etched tetraethyl ortho silicate (PETEOS), thermal oxide, undoped silicate glass, high density plasma (HDP) oxide.

Optionally, the substrate polished in the chemical mechanical polishing method of the present invention further comprises silicon nitride. The silicon nitride in the substrate, if present, can be any suitable silicon nitride material known in the art; for example, $Si_3N_4$.

The chemical mechanical polishing pad used in the chemical mechanical polishing method of the present invention can by any suitable polishing pad known in the art. The chemical mechanical polishing pad may optionally be selected from woven and non-woven polishing pads. The chemical mechanical polishing pad can be made of any suitable polymer of varying density, hardness, thickness, compressibility and modulus. The chemical mechanical polishing pad can be grooved and perforated as desired.

The substance according to formula I (most preferably benzyltrimethylammonium hydroxide) contained in the chemical mechanical polishing composition used in the chemical mechanical polishing method of the present invention enhances the removal rate of silicon oxide (as measured in angstroms per minute, Å/min). If we define the relative enhancement ($\Delta A$) of the removal rate of silicon oxide as $\Delta A = (A-A_0)/A_0$, wherein A and $A_0$ stand for the removal rates of silicon oxide, measured in Å/min using a polishing composition with (A) and without ($A_0$) the addition of a substance according to formula I in the chemical mechanical polishing composition. Inclusion of a substance according to formula I (most preferably benzyltrimethylammonium hydroxide) in the chemical mechanical polishing composition used in the method of the present invention preferably provides a $\geq 5\%$, more preferably $\geq 10\%$, enhancement in the silicon oxide removal rate. That is, at least one of the following equations is preferably satisfied:

$$(((A-A_0)/A_0)*100) \geq 5; \text{ and} \quad (i)$$

$$(((A-A_0)/A_0)*100) \geq 10, \quad (ii)$$

all as measured under the polishing conditions set forth in the Examples.

The substance according to formula I (most preferably benzyltrimethylammonium hydroxide) contained in the chemical mechanical polishing composition used in the chemical mechanical polishing method of the present invention results in an improved polishing defectivity performance. Preferably, the inclusion of the substance according to formula I in the chemical mechanical polishing composition, as an initial component, provides a $\geq 50\%$; more preferably $\geq 60\%$; most preferably $\geq 70\%$ reduction in polishing defectivity (i.e., post CMP/hydrogen fluoride scratches), as measured under the polishing conditions set forth in the Examples. That is, at least one of the following equations is preferably satisfied:

$(X_0-X)/X*100 \geq 50;$ (i)

$(X_0-X)/X*100 \geq 60;$ and, (ii)

$(X_0-X)/X*100 \geq 70;$ (iii)

wherein X is the polishing defectivity (i.e., post CMP/hydrogen fluoride scratches) for a chemical mechanical polishing composition containing the substance according to formula I used in the method of the present invention, as measured under the polishing conditions set forth in the Examples; and $X_0$ is the polishing defectivity (i.e., post CMP/hydrogen fluoride scratches) obtained under identical conditions except that the substance according to formula I is absent from the chemical mechanical polishing composition.

Desirably, in the chemical mechanical polishing method of the present invention, the chemical mechanical polishing composition comprising a substance according to formula I (most preferably benzyltrimethylammonium hydroxide) exhibits a relative enhancement ($\Delta A$) of the removal rate of silicon oxide of $\geq 5\%$; more preferably $\geq 10\%$, as measured under the polishing conditions set forth in the Examples. Still more preferably, in the chemical mechanical polishing method of the present invention, the chemical mechanical polishing composition comprising a substance according to formula I (most preferably benzyltrimethaylammonium hydroxide) exhibits a relative enhancement ($\Delta A$) of the removal rate of silicon oxide of $\geq 5\%$, more preferably $\geq 10\%$; and, simultaneously exhibits a reduction in polishing defectivity (i.e., post CMP/hydrogen fluoride scratches) of $\geq 50\%$, more preferably $\geq 60\%$, most preferably $\geq 70\%$; as measured under the polishing conditions set forth in the Examples. Most preferably, in the chemical mechanical polishing method of the present invention, the chemical mechanical polishing composition comprising a substance according to formula I (most preferably benzyltrimethylammonium hydroxide) exhibits a relative enhancement ($\Delta A$) of the removal rate of silicon oxide of $\geq 10\%$ and a reduction in polishing defectivity (i.e., post CMP/hydrogen fluoride scratches) of $\geq 70\%$, as measured under the polishing conditions set forth in the Examples.

The chemical mechanical polishing composition used in the chemical mechanical polishing method of the present invention enables operation with a low nominal polishing pad pressure, for example at 3 to 35 kPa. The low nominal polishing pad pressure improves polishing performance by reducing scratching and other undesired polish defects and minimizes damage to fragile materials.

Some embodiments of the present invention will now be described in detail in the following Examples.

EXAMPLE 1

Chemical Mechanical Polishing Compositions

The chemical mechanical polishing compositions (CMPC's) tested are described in Table 1. The chemical mechanical polishing compositions A-D are comparative formulations, which are not within the scope of the claimed invention.

TABLE 1

| CMPC | Benzyltrimethyl ammonium hydroxide (wt %) | Substance formula II[ξ] (wt %) | Abrasive[£] (wt %) | Final pH[¥] |
|---|---|---|---|---|
| A | — | — | 16[£] | 10.7 |
| B | — | — | 16[χ] | 10.7 |
| C | — | — | 16[£] | 10.7 |
| D | — | — | 16[χ] | 10.7 |
| 1 | 0.5 | 0.13[ξ] | 16[£] | 10.7 |
| 2 | 0.5 | 0.13[ξ] | 16[χ] | 10.7 |
| 3 | 0.5 | 0.24[Ψ] | 16[χ] | 10.7 |
| 4 | 0.5 | 0.13[ξ] | 16[£] | 10.7 |
| 5 | 0.5 | 0.24[Ψ] | 16[£] | 10.7 |
| 6 | 0.5 | — | 16[£] | 10.7 |
| 7 | — | 0.13[ξ] | 16[£] | 10.7 |
| 8 | — | 0.24[Ψ] | 16[£] | 10.7 |
| 9 | 0.5 | 0.13[ξ] | 16[χ] | 10.7 |
| 10 | 0.5 | 0.24[Ψ] | 16[χ] | 10.7 |

[ξ]diethylenetriaminepentakis(methylphosphonic acid) available from Alrdich
[Ψ]bis(hexamethylene)triaminepentakis(methylphosonic acid) available from Alrdich
[£]Klebosol® 1630 colloidal silica manufactured by AZ Electronic Materials and available from The Dow Chemical Company.
[χ]Klebosol® 1630N colloidal silica manufactured by AZ Electronic Materials and available from The Dow Chemical Company.
[¥]composition pH adjusted as necessary using $HNO_3$ or KOH.

EXAMPLE 2

Polishing Tests

The chemical mechanical polishing compositions described in Table 1 were tested using 200 mm blanket TEOS dielectric wafers. An Applied Materials Mirra® CMP polishing platform was used to polish all of the blanket wafers in the Examples using a polishing pad comprising a polyurethane polishing layer containing polymeric hollow core microparticles and a polyurethane impregnated non-woven subpad (namely an IC1010™ polishing pad commercially available from Rohm and Haas Electronic Materials CMP Inc.). The polishing conditions used in all of the Examples included a platen speed of 93 rpm; a carrier speed of 87 rpm; with a polishing medium flow rate of 200 ml/min and a downforce of 20.7 kPa. Removal rates for each of the polish experiments are provided in Table 2. Note that the removal rates were calculated from the before and after polish film thickness. Specifically, the removal rates were determined using a SpectraFX 200 optical thin-film metrology system available from KLA-Tencor. The defectivity performance reported in the Table 2 was determined using a Scanning Electron Microscope either after polishing ("Pst-CMP") or after a hydrogen fluoride post polishing wash ("Pst-HF"). All the TEOS wafers after Pst-HF wash were inspected using a Surfscan® SP1 defect inspection system available from KLA-Tencor. The defects information, including their coordinates on the wafer, was recorded in KLARF (KLA Results File) which was then transferred to eDR-5200 defect review system available from KLA-Tencor. A random sample of 100 defect images were selected and reviewed by eDR-5200 system. These 100 images were classified into various defect types, for example, chatter marks (scratches), particles and pad debris. Based on classification results from these 100 images, the total number of scratches on the wafer was determined.

TABLE 2

| CMPC | TEOS removal rate (Å/min) | Pst-CMP scratches | Pst-HF scratches |
|---|---|---|---|
| A (1) | 2475 | 48 | 72 |
| B (3) | 2862 | N/A | 41 |
| C (7) | 2571 | N/A | 14 |
| D (13) | 2848 | N/A | 17 |
| 1 (2) | 2698 | 8 | 15 |
| 2 (4) | 2916 | N/A | 24 |
| 3 (5) | 2898 | N/A | 12 |
| 4 (8) | 2794 | N/A | 7 |
| 5 (9) | 2745 | N/A | 9 |
| 6 (10) | 2867 | N/A | 4 |
| 7 (11) | 2730 | N/A | 16 |
| 8 (12) | 2728 | N/A | 21 |
| 9 (14) | 2924 | N/A | 6 |
| 10 (15) | 2937 | N/A | 5 |

We claim:

1. A method for chemical mechanical polishing of a substrate, comprising:

providing a substrate, wherein the substrate comprises silicon oxide;

providing a chemical mechanical polishing composition, consisting of, as initial components: water; 5 to 25 wt % of an abrasive, wherein the abrasive is a colloidal silica having an average particle size of 10 to 200 nm; a pH adjusting agent, wherein the pH adjusting agent is selected from the group consisting of an inorganic acid and an inorganic base; and 0.001 to 1 wt % of a substance according to formula I

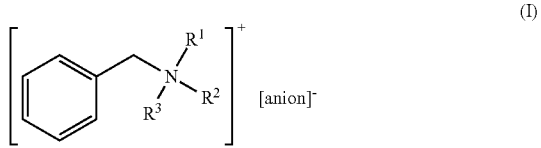

(I)

wherein $R^1$, $R^2$ and $R^3$ are each independently selected from a $C_{1-4}$ alky group; wherein the chemical mechanical polishing composition has a pH of 10-11;

providing a chemical mechanical polishing pad with a polishing surface, wherein the chemical mechanical polishing pad composes a polyurethane polishing layer containing polymeric hollow core microparticles and a polyurethane impregnated non-woven subpad;

moving the polishing surface relative to the substrate, wherein at least some of the silicon oxide is removed from the substrate;

dispensing the chemical mechanical polishing composition onto the polishing surface; and, abrading at least a portion of the substrate to polish the substrate;

wherein the substance according to formula I included in the chemical mechanical polishing composition provides an enhanced silicon oxide removal rate and an improved polishing defectivity performance; wherein the improved polishing defectivity performance is determined with a platen speed of 93 revolutions per minute, a carrier speed of 87 revolutions per minute a chemical mechanical polishing composition flow rate of 200 ml/mm, a nominal down force of 20.7 kPa on a 200 mm polishing machine such that the following expression is satisfied:

$$X < X_0$$

where X is a count of scratch defects on the polished substrate following a post polish hydrogen fluoride wash for the chemical mechanical polishing composition and $X_0$ is a count of scratch defects obtained under identical conditions except that the substance according to formula I is absent from the chemical mechanical polishing composition.

2. The method of claim 1, wherein the chemical mechanical polishing composition exhibits a silicon oxide removal rate of >2,000 Å/min; with a platen speed of 93 revolutions per minute, a carrier speed of 87 revolutions per minute, a chemical mechanical polishing composition flow rate of 200 ml/min, a nominal down force of 20.7 kPa on a 200 mm polishing machine; wherein the chemical mechanical polishing pad comprises a polyurethane polishing layer containing polymeric hollow core microparticles and a polyurethane impregnated non-woven subpad.

3. The method of claim 2, wherein at least one of the following equations is satisfied:

$$(((A-A_0)/A_0)*100) \geq 5; \text{ and} \quad (i)$$

$$(((A-A_0)/A_0)*100) \geq 10, \quad (ii)$$

wherein A is the removal rate of silicon oxide, measured in Å/min, using the chemical mechanical polishing composition and $A_0$ is a removal rate of silicon oxide, measured in Å/min, under identical conditions except that the substance according to formula I is absent.

* * * * *